United States Patent [19]

Seevinck et al.

[11] Patent Number: 4,682,098

[45] Date of Patent: Jul. 21, 1987

[54] VOLTAGE-CURRENT CONVERTER

[75] Inventors: Evert Seevinck, Eindhoven; Roelof F. Wassenaar, Enschede; Eerke Holle, Eindhoven, all of Netherlands

[73] Assignee: U.S. Philips Corporation, New York, N.Y.

[21] Appl. No.: 880,854

[22] Filed: Jul. 1, 1986

[30] Foreign Application Priority Data

Jul. 1, 1985 [NL] Netherlands .................. 8501882

[51] Int. Cl.$^4$ ............................. G05F 3/20; G05F 1/56
[52] U.S. Cl. ...................................... 323/315; 323/316; 307/491
[58] Field of Search ...................... 323/312, 315, 316; 307/296 R, 297, 490, 491

[56] References Cited

U.S. PATENT DOCUMENTS

| | | | |
|---|---|---|---|
| 4,268,759 | 5/1981 | Gilbert | 307/490 |
| 4,354,122 | 10/1982 | Embree et al. | 323/316 X |
| 4,388,539 | 6/1983 | Boeke | 323/316 X |
| 4,550,262 | 10/1985 | Kohsiek | 323/316 X |
| 4,560,920 | 12/1985 | Okanobu | 323/316 X |

Primary Examiner—Peter S. Wong
Attorney, Agent, or Firm—Robert T. Mayer; Bernard Franzblau

[57] ABSTRACT

A voltage-current converter includes a first current-source ($I_1$) coupled by means of a diode-arranged first transistor ($T_1$) to a first terminal (1) at reference potential and by means of a diode-arranged second transistor ($T_2$) to a second terminal (2). The bases of a third ($T_3$) and a fourth ($T_4$) transistor are coupled to the first (1) and the second (2) terminal, respectively. The emitters of these transistors ($T_3, T_4$) are coupled to a second current source ($I_2$). A voltage source (V) and a resistor ($R_1$) for converting the voltage (V) into a signal current are arranged between the first (1) and the second (2) terminal. The signal current is amplified by the translinear-circuit of the first, second, third and fourth transistors ($T_1$-$T_4$) and fed to the outputs (30,40) via cascode transistors ($T_9, T_{10}$). To correct the non-linearity in the voltage-current conversion due to the non-linear emitter resistors of the first ($T_1$) and the second ($T_2$) transistor, a correction circuit (5) having a negative input resistance is coupled to the first (1) and the second (2) terminal.

8 Claims, 2 Drawing Figures

VOLTAGE-CURRENT CONVERTER

BACKGROUND OF THE INVENTION

The invention relates to a voltage-current converter comprising, between a first and a second supply terminal, a first current source coupled at one end by means of a first transistor arranged as a diode to a first terminal for conveying a reference potential and at the other end by means of a second transistor arranged as a diode to a second terminal. A series arrangement of an input port for applying a signal voltage and a first resistor for converting the signal voltage into a signal current are provided between the first and the second terminal, the converter further comprises third and fourth transistors whose bases are coupled to the first and the second terminal, respectively, the emitters being connected by means of a common second current source to the second supply terminal and the collector of at least one of the third and fourth transistors constituting an output for supplying an output current which is proportional to the signal current. The converter also comprising a correction circuit for correcting the non-linearity in the voltage-current conversion due to the non-linear emitter resistors of the first and second transistors.

A voltage-current converter of this type can be generally used and is particularly suitable for use in a device for measuring the effective value of a signal voltage.

A voltage-current converter of this type is known from U.S. Pat. No. 4,268,759. In this converter the first and the second transistor convey the same bias current. Since the first terminal is connected to ground, the second terminal constitutes a virtual ground. The signal voltage which is converted into a signal current across the first resistor is superposed on the bias currents of the first and second transistors. Together with the first and the second transistor, the third and the fourth transistor constitute a so-called translinear circuit in which the signal currents of the first and the second transistor are transferred in an amplified manner to the third and fourth resistor.

In this converter the non-linear emitter resistors of the first and the second transistor produce a linearity error in the voltage-current conversion. In order to correct this error the known converter comprises a correction circuit which is constituted by two transistors having their bases and collectors cross-coupled and in which one transistor is connected between the emitter of the first transistor and the first terminal and the other transistor is connected between the emitter of the second transistor and the second terminal.

A drawback of this correction circuit is, however, that at relatively high frequencies of the order of several tens of MHz it has a resonant rise effect causing errors in the voltage-current conversion.

SUMMARY OF THE INVENTION

It is therefore the object of the invention to provide a voltage-current converter which has a linear voltage-current conversion over a relatively large frequency range. According to the invention a voltage-current converter of the type described in the opening paragraph is characterized in that the correction circuit is constituted by a circuit having a first input terminal which is coupled to the first terminal and the second input terminal which is coupled to the second terminal, and which has a negative input impedance whose resistance is substantially equal to that of the first resistor.

The negative resistance of the correction circuit compensates for the non-linearity in the voltage-current conversion caused by the non-linearity of the emitter resistors of the first and the second transistor. Unlike the circuit in the known converter since the correction circuit is not incorporated in the signal path of the first and second transistor, the correction circuit does not influence the voltage-current conversion. The conversion is therefore linear over a large frequency range.

An embodiment of a correction circuit may be characterized in that the correction circuit is constituted by a fifth transistor whose collector is coupled to the first terminal and whose emitter is connected to one end of a second resistor and by means of a third current source of the second supply terminal, and is constituted by a sixth transistor whose collector is coupled to the second terminal and whose emitter is connected to the other end of the second resistor and by means of a fourth current source to the second supply terminal, the base of the fifth transistor being connected to the collector of the sixth transistor and the base of the sixth transistor being connected to the collector of the fith transistor.

According to a further embodiment this correction circuit may be characterized in that the collector of the fifth transistor is connected by means of a seventh transistor arranged as a diode to the first terminal and in that the collector of the sixth transistor is connected to the second terminal by means of an eighth transistor arranged as a diode. The seventh and eighth transistors correct the non-linearity of the correction circuit caused by the non-linearity of the emittor resistors of the fifth and sixth transistors.

A further embodiment may be characterized in that the third transistor and the fourth transistor are arranged in cascode with a ninth and tenth transistor, respectively, whose bases are connected to the bases of the first and the second transistors. By virtue of the cascode arrangements the Early effect of the third and the fourth transistors is reduced.

A further embodiment is characterized in that the second terminal is coupled to a fifth current source for supplying a current which compensates for the base current of the third and the fourth transistors. Due to this extra current source errors caused in the conversion by the base currents of the third and the fourth transistors are prevented.

BRIEF DESCRIPTION OF THE DRAWINGS

The invention will now be described in greater detail with reference to the accompanying drawing in which.

DESCRIPTION OF THE PREFERRED EMBODIMENTS

Figure 1:
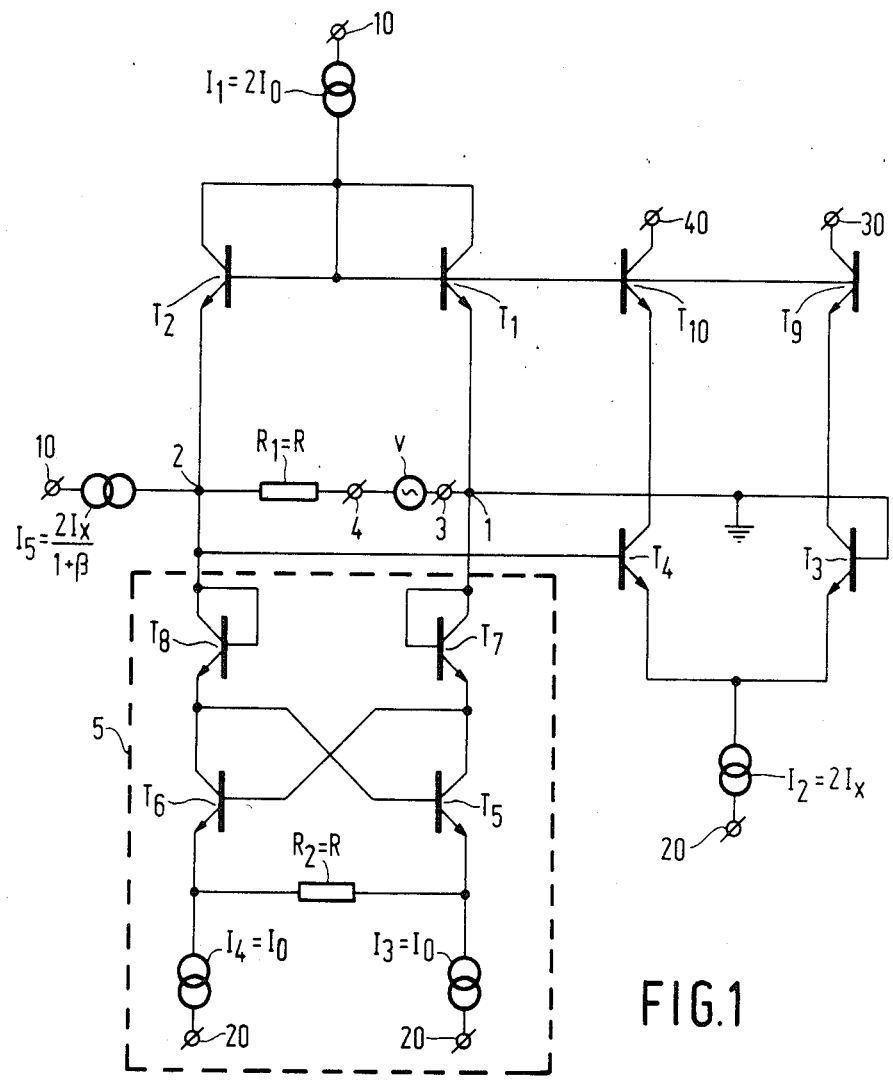
FIG. 1 shows an embodiment of a voltage-current converter according to the invention.

FIG. 1 shows an embodiment of a voltage-current converter according to the invention. The converter includes a first current source $I_1 = 2I_0$ which is connected to the positive supply terminal 10 and has its output connected to a transistor $T_1$ arranged as a diode and a transistor $T_2$ arranged as a diode. The emitter of transmitter $T_1$ is connected to a first terminal 1 and the emitter of transmitter $T_2$ is connected to a second terminal 2. Arranged between these terminals 1 and 2 is the series arrangement of a signal voltage source V which is provided between an input part consisting of input terminals 3 and 4 and a first resistor $R_1 = R$. The terminal 1 is also connected to the base of a transistor $T_3$ and the terminal 2 is connected to the base of a transistor $T_4$. The emitters of these transistors $T_3$, $T_4$ are connected via a common current source $I_2 = 2I_x$ to the negative supply terminal 20. The transistors $T_3$ and $T_4$ are each arranged in cascode with a transistor $T_9$ and a transistor $T_{10}$, respectively. The bases of these transistors $T_9$, $T_{10}$ are connected to the bases of transistors $T_1$ and $T_2$. The collector of transistor $T_9$ constitutes the one output 30 and the collector of transistor $T_{10}$ constitutes the other output 40 of the converter. The converter also comprises a correction circuit 5 which is provided with two transistors $T_5$ and $T_6$ whose bases are cross-coupled to the collectors. A second resistor $R_2 = R$ is arranged between the emitters of these transistors $T_5$, $T_6$. The emitter of transistor $T_5$ is connected to the negative supply terminal 20 by means of a third current source $I_3 = I_0$ and the emitter of transistor $T_6$ is connected to the negative supply terminal 20 by means of a fourth current source $I_4 = I_0$.

To explain the operation of the circuit arrangement the correction circuit is initially not dealt with and the transistors $T_1$ and $T_2$ are assumed to have no influence on the voltage-current conversion. In the rest condition a current $I_0$ flows through the transistors $T_1$ and $T_2$ and a current $I_x$ flows through the transistors $T_3$ and $T_4$. When an input voltage V is applied, a signal current i flows through resistor $R_1$, which current also flows through the transistors $T_1$ and $T_2$. A current $I_{T1} = I_0 + i$ then flows through transistors $T_1$ and a current $I_{T2} = I_0 - i$ flows through transistor $T_2$. The transistors $T_1$ to $T_4$ constitute a so-called translinear circuit in which the sum of the base-emitter voltage is equal to zero. The following relation applies to the circuit.

$$V_{BET1} + V_{BET3} = V_{BET2} + V_{BET4} \quad (1)$$

in which $V_{BE}$ is the base emitter voltage of the relevant transistor. With the known exponential relation between the collector circuit and the emitter voltage and assuming that the transistors have equal emitter surfaces, it follows from the above mentioned question that:

$$I_{T1} \cdot I_{T3} = I_{T2} \cdot I_{T4} \quad (2)$$

With the equations for the current $I_{T1}$ and $I_{T2}$ it then follows for the currents through the transistors $T_3$ and $T_4$ that:

$$I_{T3} = I_x - \frac{I_x}{I_0} \cdot i \quad (3)$$

$$I_{T4} = I_x + \frac{I_x}{I_0} \cdot i$$

This equation shows that the signal current i through the translinear circuit $T_1$ to $T_4$ becomes available in the differential form and by suitable choice of the ratio of the basis current $I_x$ and $I_o$ becomes available in an amplified form. The currents $I_{T3}$ and $I_{T4}$ are conveyed via the cascode transistors $T_9$ and $T_{10}$ to the outputs 30 and 40, respectively. The transistors $T_9$ and $T_{10}$ prevent these currents being detrimentally influenced by the Early effect in the transistors $T_3$ and $T_4$.

The voltage-current conversion has a non-linearity which is caused by the non-linear and signal value-dependent emitter resistors of the transistors $T_1$ and $T_2$. This non-linearity is corrected by the correction circuit 5 which has a negative input impedance $-R$ between its input terminals 1 and 2. This is evident as follows. If a direct voltage U is applied between the input terminals 1 and 2 of the correction circuit, at which voltage the terminal 2 is positive relative to terminal 1, a current $I_o + i$ flows through transistors $T_8$ and $T_6$, a current $I_o - i$ flows through the transistors $T_7$ and $T_5$ and only the signal current i flows through resistor $R_2 = R$. The following equation then applies to the correction circuit:

$$U = V_{BET8} + V_{BET5} - i \cdot R - V_{BET6} - V_{BET7} \quad (4)$$

with $V_{BET6} = V_{BET8}$ and $V_{BET5} = V_{BET7}$ it follows that $$U = -i \cdot R \text{ or } U/i = -R \quad (5)$$

Figure 2:
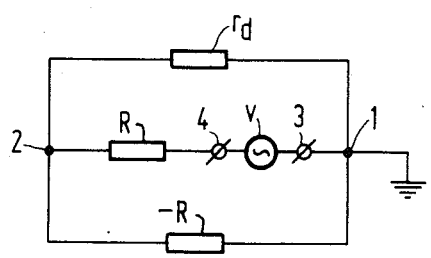
FIG. 2 is a simplified circuit diagram to explain the operation of the converter of FIG. 1.

The correcting effect of the correction circuit 5 will be explained with reference to FIG. 2 in which this circuit is diagrammatically represented by a negative resistor $-R$ and the total non-linear signal dependent emitter resistor of the transistors $T_1$ and $T_2$ is represented by a resistor $r_d$. If $i_1$ is the current through resistor R, $i_2$ is the current through resistor $-R$ and i is the current through resistor $r_d$, the following equations apply:

$$V - i_1 R - i r_d = 0 \text{ and}$$

$$V - i_1 R + i_2 \cdot R = 0 \quad (6)$$

With $i_1 = i + i_2$ it follows that $$\frac{V - i \cdot r_d}{R} = i - \frac{i \cdot r_d}{R} \quad (7)$$

thus obtaining:

$$i = V/R \quad (8)$$

The signal current i through the transistors $T_1$ and $T_2$ is thus independent of the non-linear resistance $r_d$ of the transistors $T_1$ and $T_2$ and increases linearly with the input voltage V. It is to be noted that the transistors $T_7$ and $T_8$ arranged as a diode correct the non-linearity of the correction circuit 5 themselves, which non-linearity is caused by the non-linear emitter resistors of the transistors $T_5$ and $T_6$. This is simply evident from equation 4.

The influence of the base currents of transistors $T_3$ and $T_4$ on the voltage-current conversion is reduced by a current source $I_5$ supplying the base currents for these transistors.

The voltage-current converter shown in FIG. 1 has a linearity error which is less than 1% in the frequency range of 0–30 MHz.

The invention is not limited to the embodiment described. Instead of the compensation circuit shown other compensation circuits having a negative input resistance may be alternatively used.

What is claimed is:

1. A voltage-current converter comprising: a first and a second supply terminal, a first current source coupled at one end to the first supply terminal and by means of a first transistor connected as a diode to a first terminal at a reference potential and by means of a second transistor connected as a diode to a second terminal, means coupling a series arrangement of an input port for applying a signal voltage and a first resistor for converting the signal voltage into a signal current between the first and the second terminal, a third and a fourth transistor having bases coupled to the first and the second terminal, respectively, means connecting the emitters of the third and fourth transistors by means of a common second current source to the second supply terminal and wherein the collector of at least one of the third and fourth transistors forms an output for supplying an output current proportional to the signal current, and a correction circuit for correcting a non-linearity in the voltage-current conversion due to non-linear emitter resistors of the first and the second transistor, the correction circuit comprising a circuit having a first input terminal coupled to the first terminal and a second input terminal coupled to the second terminal, said correction circuit having a negative input impedance whose resistance is substantially equal to the resistance of the first resistor.

2. A voltage-current converter as claimed in claim 1 wherein the correction circuit comprises a fifth transistor having a collector coupled to the first terminal and an emitter connected to one end of a second resistor and by means of a third current source to the second supply terminal, and a sixth transistor having a collector coupled to the second terminal and an emitter connected to the other end of the second resistor and by means of a fourth current source to the second supply terminal, the base of the fifth transistor being connected to the collector of the sixth transistor and the base of the sixth transistor being connected to the collector by the fifth transistor.

3. A voltage-current converter as claimed in claim 2, wherein the collector of the fifth transistor is connected by means of a seventh transistor connected as a diode to the first terminal and the collector of the sixth transistor is connected by means of an eighth transistor connected as a diode to the second terminal.

4. A voltage-current converter as claimed in claim 3, characterized in that the third transistor and the fourth transistor are connected to cascode with a ninth and a tenth transistor, respectively, whose bases are connected to the bases of the first and the second transistor.

5. A voltage-current converter as claimed in claim 1 further comprising means coupling the second terminal to a third current source for supplying a current which compensates for the base currents of the third and the fourth transistor.

6. A voltage-current converter as claimed in claim 1, further comprising fifth and sixth transistors connected in cascode with the third and fourth transistors, respectively, means connecting the bases of the fifth and sixth transistors to the bases of the first and second transistors, and wherein the collector of at least one of said fifth and sixth transistors forms said output for supplying the output current proportional to the signal current.

7. A voltage-current converter as claimed in claim 6, further comprising means coupling the second terminal to a third current source which supplies a current that compensates base currents of the third and fourth transistors.

8. A voltage-current converter as claimed in claim 2, further comprising means coupling the second terminal to a third current source which supplies a current that compensates base currents of the third and fourth transistors.

* * * * *